United States Patent
Codecasa et al.

(10) Patent No.: US 7,360,365 B2
(45) Date of Patent: Apr. 22, 2008

(54) THERMOELECTRIC HEAT PUMPS

(75) Inventors: Matteo Codecasa, Lecco (IT); Giorgio Pastorino, Malgrate (IT)

(73) Assignee: Peltech S.r.l. (IT)

( * ) Notice: Subject to any disclaimer, the term of this patent is extended or adjusted under 35 U.S.C. 154(b) by 38 days.

(21) Appl. No.: 10/597,693

(22) PCT Filed: Feb. 28, 2005

(86) PCT No.: PCT/IT2005/000112

§ 371 (c)(1),
(2), (4) Date: Sep. 27, 2006

(87) PCT Pub. No.: WO2005/086246

PCT Pub. Date: Sep. 15, 2005

(65) Prior Publication Data

US 2007/0157629 A1    Jul. 12, 2007

(30) Foreign Application Priority Data

Mar. 2, 2004   (IT)   .................. MI20040079 U

(51) Int. Cl.
F25B 21/02    (2006.01)
(52) U.S. Cl. .......................... 62/3.3; 62/3.7
(58) Field of Classification Search .............. 62/3.2, 62/3.3, 3.6, 3.7
See application file for complete search history.

(56) References Cited

U.S. PATENT DOCUMENTS

| | | | |
|---|---|---|---|
| 4,242,874 A | | 1/1981 | Simms |
| 4,563,725 A | * | 1/1986 | Kirby .......................... 361/708 |
| 4,611,089 A | | 9/1986 | Elsner et al. |
| 4,710,852 A | * | 12/1987 | Keen .......................... 361/717 |
| 5,099,550 A | | 3/1992 | Beane et al. |
| 5,939,667 A | | 8/1999 | Oudoire et al. |
| 6,502,405 B1 | * | 1/2003 | Van Winkle ................. 62/3.61 |
| 2003/0193087 A1 | | 10/2003 | Hayashi et al. |

FOREIGN PATENT DOCUMENTS

| | | |
|---|---|---|
| EP | 0 116 396 | 1/1984 |
| EP | 1 227 375 | 7/2002 |
| GB | 2 381 377 | 4/2003 |

OTHER PUBLICATIONS

M.P. Codecasa, et al., Optimization of a New Thermoelectric Colling Assembly . . . , 2003 Twenty-Second International Conference on ICT LA Grande Motte, pp. 614-618, 2003, XP010697389.

\* cited by examiner

*Primary Examiner*—Melvin Jones
(74) *Attorney, Agent, or Firm*—Lucas & Mercanti, LLP

(57) ABSTRACT

The thermoelectric heat pump comprises one or more thermoelectric modules having a hot side connected to a first heat exchanger and a cold side connected to a second heat exchanger, and is characterized in that it comprises a pair of elongated bar-like elements made of an electrically and thermally insulating material which are arranged at two parallel sides of the heat exchangers, at least partly interposed between facing flanges of said heat exchangers, at least one of said elongated bar-like elements including electric conductors for supplying power to the thermoelectric modules, as well as conductors for supplying control signals therefor, and that said heat exchangers contacting the thermoelectric modules are linked one another via a plurality of fasteners, each fastener being formed of a substantially C-shaped metal clip.

5 Claims, 1 Drawing Sheet

THERMOELECTRIC HEAT PUMPS

TECHNICAL FIELD

The present invention generally relates to the filed of thermoelectricity, and particularly an improved kind of thermoelectric heat pump.

PRIOR ART

Thermoelectric heat pumps are solid state devices which make use of a thermoelectric effect known as Peltier effect for refrigerating and/or heating purposes in the domestic and/or industrial field.

These devices generally include a thermoelectric module which is formed of an array of thermoelectric elements consisting in conductors or semiconductors of the P and N type which are connected electrically in series and thermally in parallel together. The thermoelectric elements are assembled on supports of electrically insulating and thermally conducting material which is generally a ceramic-like material. The thermoelectric modules are connected to heat exchangers for forming a heat pump intended for domestic and industrial applications.

The thermoelectric heat pumps known in the art generally exhibit some drawbacks concerning the way the heat exchangers are connected to the thermoelectric modules and how the latter are electrically connected to a power source, as well as to a controller.

The present invention addressees these drawbacks of the known art by providing an improved thermoelectric heat pump.

DISCLOSURE OF THE INVENTION

According to the present invention, the thermoelectric heat pump comprises one or more thermoelectric modules having a hot side connected to a first heat exchanger and a cold side connected to a second heat exchanger, and is characterised in that it comprises a pair of elongated bar-like elements made of an electrically and thermally insulating material which are arranged at two parallel sides of the heat exchangers, at least partly interposed between facing flanges of said heat exchangers, at least one of said elongated bar-like elements including electric conductors for supplying power to the thermoelectric modules, as well as conductors for supplying control signals therefor, and that said heat exchangers contacting the thermoelectric modules are linked one another via a plurality of fasteners, each fastener being formed of a substantially C-shaped metal clip and being apt to grip with both ends thereof the facing flanges of the heat exchangers in order to hold them together, at least one of said ends of the fastener gripping a corresponding flange of a heat exchanger indirectly with the interposition of a transverse extension of the elongated bar-like elements so as to break the thermal bridge which otherwise would be formed between one heat exchanger and the other.

BRIEF DESCRIPTION OF THE DRAWINGS

The present invention will be disclosed in detail with reference to the accompanying drawing wherein.

BEST MODE OF CARRYING OUT THE INVENTION

Figure 1:
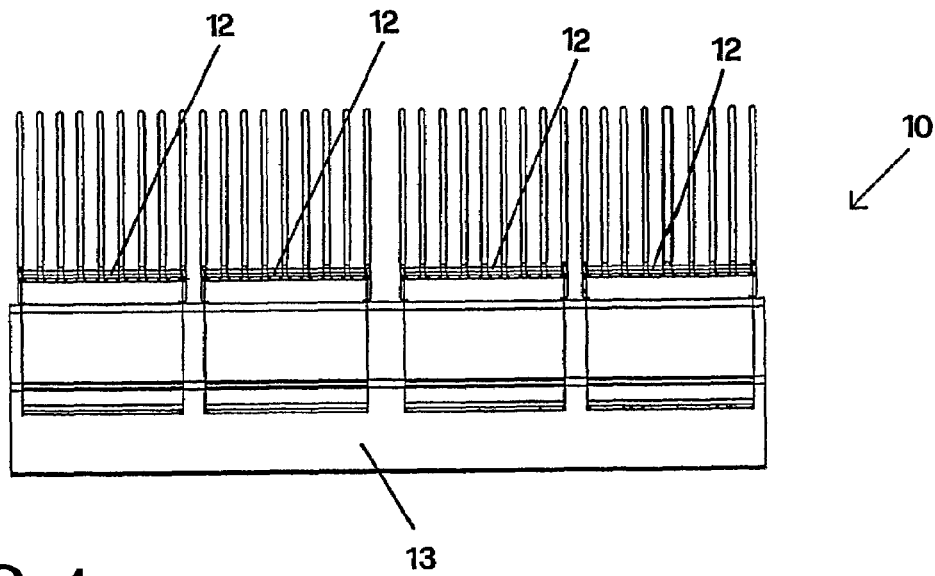
FIGS. 1 and 2 are a front elevation view and a side elevation view of the heat pump, respectively.
Figure 2:
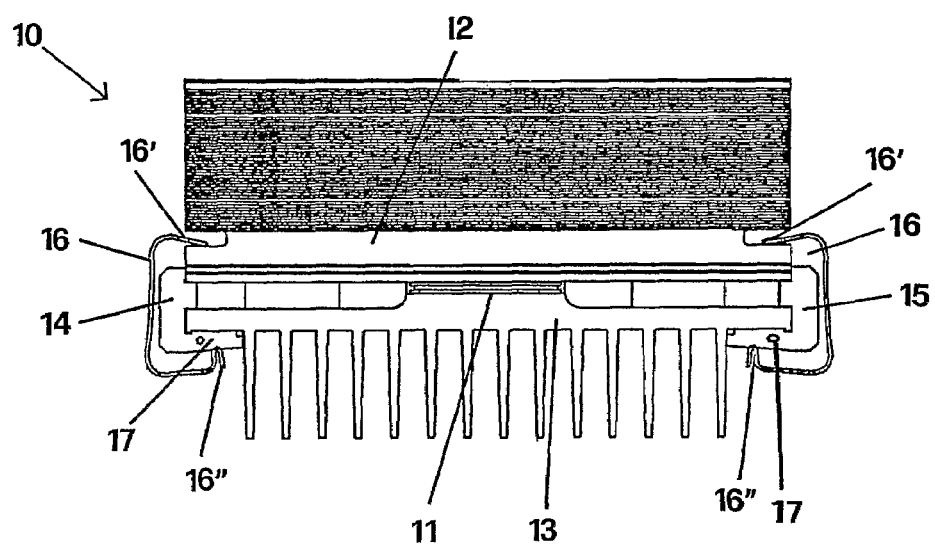

Referring to the FIGS. of the drawing, numeral 10 generally designates a heat pump comprising at least a thermoelectric module 11 connected to a first heat exchanger 12, which thermally contacts the a hot side of the thermoelectric module, and to a second heat exchanger 13, which thermally contacts a cold side of the thermoelectric module.

The configuration of the thermoelectric heat pump 10 provides an array of thermoelectric modules 11 thermally connected one another in parallel, wherein a hot side of each thermoelectric module 11 thermally contacts a separate heat exchanger, whereas a cold side thermally contacts a heat exchanger which is common to all the thermoelectric modules 11 of the array.

The configuration of the thermoelectric heat pump 10 may also provide an array of thermoelectric modules 11 thermally connected one another in parallel, wherein each hot side and cold side of the thermoelectric modules 11 contact separate heat exchangers, or alternatively heat exchanger which are common to all the thermoelectric modules 11 of the array.

The heat exchangers 12 and 13 are arranged in the thermoelectric heat pump so that the fluid currents which touch the thermal exchange surfaces have cross flow directions.

The structure disclosed above is particularly advantageous in that it provides a heat pump which is capable of adapting itself to different application requirements.

For the supply of power to the thermoelectric modules 11 an insulated bus-bar conductor 14 is provided which is made of an electrically and thermally insulating material containing inside the conductors for supplying electric power to the thermoelectric modules 11. The bus-bar conductor 14 may also be used for carrying electrical conductors of a controller circuit means for the thermoelectric modules 11, as well as power supply circuit means for supplying power to a circulating means for causing a current flow of a heat exchange medium over the surfaces of the heat exchangers 12, 13. The bus-bar conductor 14 is located on a side of the thermoelectric heat pump 10 and arranged near a pair of edges of facing flanges of the heat exchangers 12, 13, at least in part inserted between said edges of the flanges of the heat exchangers 12,13. A similar insulated bus-bar conductor, designated by 15, which may have other purpose of power or signal supply to the thermoelectric modules 11, or alternatively a bar of electrically and thermally insulating material is arranged on the opposite side of the thermoelectric heat pump 10. Insulated bus-bars 14, 15 are interposed at least partly between the facing flanges of the heat exchangers 12,13 without interfering therewith.

The heat exchangers 12,13 are thermally into contact with the thermoelectric modules 11 and connected one another via a plurality of fasteners 16 each being formed of a substantially C-shaped metal clip. Each fasteners grips the facing flanges of the heat exchangers with its ends 16',16", at least one of said ends indirectly through an interposing transverse extension 17 of the insulating bus-bar 14,15 which, because of its being electrically and thermally insulating, breaks the thermal bridge which otherwise would be formed between the heat exchangers.

As seen in the drawings, the concave portion of each fastener 16 encloses the insulated bus-bar 14,15.

The fasteners 16 are preferably made of stainless steel and are designed in way that there load is adequate to the estimated operating load in order to assure a thermal contact between the heat exchangers 12,13 and the thermoelectric modules in a large range of operating conditions, and developing the clamping force without exceeding the yield point. The fasteners 16 are designed to develop a clamping force which is adequate to assure a good contact between the heat exchangers 12, 13 and the thermoelectric modules 11 in a large range of changes in operating conditions in order to reduce thermal resistance.

The invention claimed is:

1. A thermoelectric heat pump (10) comprising one or more thermoelectric modules (11) having a hot side connected to a first heat exchanger (12) and a cold side connected to a second heat exchanger (13), characterised in that it comprises a pair of elongated bar-like elements (14, 15) made of an electrically and thermally insulating material which are arranged at two parallel sides of the heat exchangers (12, 13), at least partly interposed between facing flanges of said heat exchangers, at least one of said elongated bar-like elements (14, 15) including electric conductors for supplying power to the thermoelectric modules (11), as well as conductors for supplying control signals therefor, and that said heat exchangers (12, 13) contacting the thermoelectric modules (11) are linked one another via a plurality of fasteners (16), each fastener being formed of a substantially C-shaped metal clip and being apt to grip with both ends (16',16") thereof the facing flanges of the heat exchangers (12, 13) in order to hold them together, at least one (16") of said ends of the fastener (16) gripping a corresponding flange of a heat exchanger (12, 13) indirectly with the interposition of a transverse extension (17) of the elongated bar-like elements (14, 15) so as to break the thermal bridge which otherwise would be formed between one heat exchanger and the other.

2. The thermoelectric heat pump of claim 1, characterised in that the concave portion of each substantially C-shaped fastener (16) encloses the elongated bar-like elements (14, 15).

3. The thermoelectric heat pump of claim 1, characterised in that the fasteners (16) are made of stainless steel and are designed to assure a load on a large operating range in order to develop the clamping force without exceeding the yield point.

4. The thermoelectric heat pump of claim 1, characterised in that the heat exchangers (12, 13) are arranged in the thermoelectric heat pump in a way that the currents of heat exchange medium touching separately the heat exchange surfaces have cross flow directions.

5. The thermoelectric heat pump of claim 1, characterised in that at least one of the elongated bar-like elements (14, 15) contains the power supply conductors to a circulating means for generating a forced flow of a heat exchange medium which contacts the surface of the heat exchangers.

* * * * *